US010636728B2

(12) United States Patent
Kikuchi et al.

(10) Patent No.: US 10,636,728 B2
(45) Date of Patent: Apr. 28, 2020

(54) SEMICONDUCTOR DEVICE

(71) Applicant: KABUSHIKI KAISHA TOSHIBA, Tokyo (JP)

(72) Inventors: Koji Kikuchi, Tatsuno Hyogo (JP); Ryuta Arai, Kuwana Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 231 days.

(21) Appl. No.: 15/693,258

(22) Filed: Aug. 31, 2017

(65) Prior Publication Data

US 2018/0277467 A1 Sep. 27, 2018

(30) Foreign Application Priority Data

Mar. 24, 2017 (JP) .................. 2017-059842

(51) Int. Cl.
*H01L 23/495* (2006.01)
*H01L 23/31* (2006.01)
*H01L 29/78* (2006.01)
*H01H 47/32* (2006.01)

(52) U.S. Cl.
CPC .... *H01L 23/49562* (2013.01); *H01L 23/3114* (2013.01); *H01L 23/4952* (2013.01); *H01L 23/49503* (2013.01); *H01L 23/49575* (2013.01); *H01H 47/325* (2013.01); *H01L 29/7802* (2013.01); *H01L 29/7805* (2013.01); *H01L 2224/48247* (2013.01)

(58) Field of Classification Search
CPC ......... H01L 23/49562; H01L 23/49503; H01L 23/3114; H01L 29/7805; H01H 47/325

USPC .................................................. 361/160, 56
See application file for complete search history.

(56) References Cited

U.S. PATENT DOCUMENTS

| | | | | | |
|---|---|---|---|---|---|
| 5,691,557 A | * | 11/1997 | Watanabe | ........... | H01L 27/0251 257/357 |
| 5,963,407 A | * | 10/1999 | Fragapane | ......... | H03K 17/0828 361/115 |
| 6,172,383 B1 | * | 1/2001 | Williams | ................ | H02M 1/32 257/173 |
| 6,385,028 B1 | * | 5/2002 | Kouno | ................ | H01L 27/0629 257/E27.016 |
| 6,614,633 B1 | * | 9/2003 | Kohno | ................ | H01L 27/0266 361/111 |
| 6,965,150 B2 | | 11/2005 | Higashida et al. | | |

(Continued)

FOREIGN PATENT DOCUMENTS

JP 2004214353 A 7/2004
JP 2008035067 A 2/2008

(Continued)

*Primary Examiner* — Dharti H Patel
(74) *Attorney, Agent, or Firm* — Kim & Stewart LLP

(57) ABSTRACT

A semiconductor device includes field-effect transistor having a gate, a drain, and a source. A first clamping circuit is connected between the drain and the gate. The first clamping circuit has a first clamp voltage that is lower than a source-to-drain breakdown voltage of the field-effect transistor. A first resistor in the device has a first end connected to a first node between the first clamping circuit and the gate. A second clamping circuit is connected between the drain and a second end of the first resistor. The second clamping circuit has a second clamp voltage is higher than the first clamp voltage and lower than the source-to-drain breakdown voltage.

20 Claims, 5 Drawing Sheets

(56) References Cited

U.S. PATENT DOCUMENTS

| | | | | |
|---|---|---|---|---|
| 7,768,034 B2* | 8/2010 | Calafut | ............... | H01L 27/0255 |
| | | | | 257/173 |
| 8,987,814 B2 | 3/2015 | Kawaguchi | | |
| 9,531,263 B2* | 12/2016 | Hayashi | ............. | H03K 17/0822 |
| 2010/0103572 A1* | 4/2010 | Worley | ............... | H01L 27/0255 |
| | | | | 361/56 |
| 2013/0044397 A1* | 2/2013 | Tsai | ....................... | H02H 9/046 |
| | | | | 361/56 |
| 2014/0085760 A1* | 3/2014 | Lui | .................... | H01L 27/0255 |
| | | | | 361/91.5 |
| 2015/0049406 A1* | 2/2015 | Besse | ....................... | H02H 9/02 |
| | | | | 361/57 |
| 2016/0181789 A1* | 6/2016 | Schnell | ............... | H02H 7/1225 |
| | | | | 361/27 |

FOREIGN PATENT DOCUMENTS

| | | | |
|---|---|---|---|
| JP | 4369009 B2 | 11/2009 | |
| JP | 4917709 B2 | 4/2012 | |
| JP | 2014216573 A | 11/2014 | |

* cited by examiner

US 10,636,728 B2

SEMICONDUCTOR DEVICE

This application is based upon and claims the benefit of priority from Japanese Patent Application No. 2017-059842, filed Mar. 24, 2017, the entire contents of which are incorporated herein by reference.

FIELD

Embodiments described herein relate generally to semiconductor devices.

BACKGROUND

In a metal oxide semiconductor field-effect transistor (MOSFET) that is used as a switch circuit of a relay, a large induced current is input to the drain since the drain is connected to an external power supply via a coiled wire. In order to protect the MOSFET from this induced current, a technique of connecting a diode between the drain and the gate of the MOSFET for clamping a voltage is proposed. However, if the clamp voltage of the diode is high, the MOSFET cannot be protected effectively and if the clamp voltage is low, the diode itself may be damaged.

DETAILED DESCRIPTION

In general, according to one embodiment, a semiconductor device includes field-effect (e.g., MOSFET) transistor having a gate, a drain, and a source. A first clamping circuit is connected between the drain and the gate and has a first clamp voltage that is lower than a source-to-drain breakdown voltage of the field-effect transistor. A first resistor has a first end connected to a first node between the first clamping circuit and the gate. A second clamping circuit is connected between the drain and a second end of the first resistor and has a second clamp voltage is higher than the first clamp voltage and lower than the source-to-drain breakdown voltage.

Hereinafter, example embodiments will be described with reference to the drawings.

Figure 1:
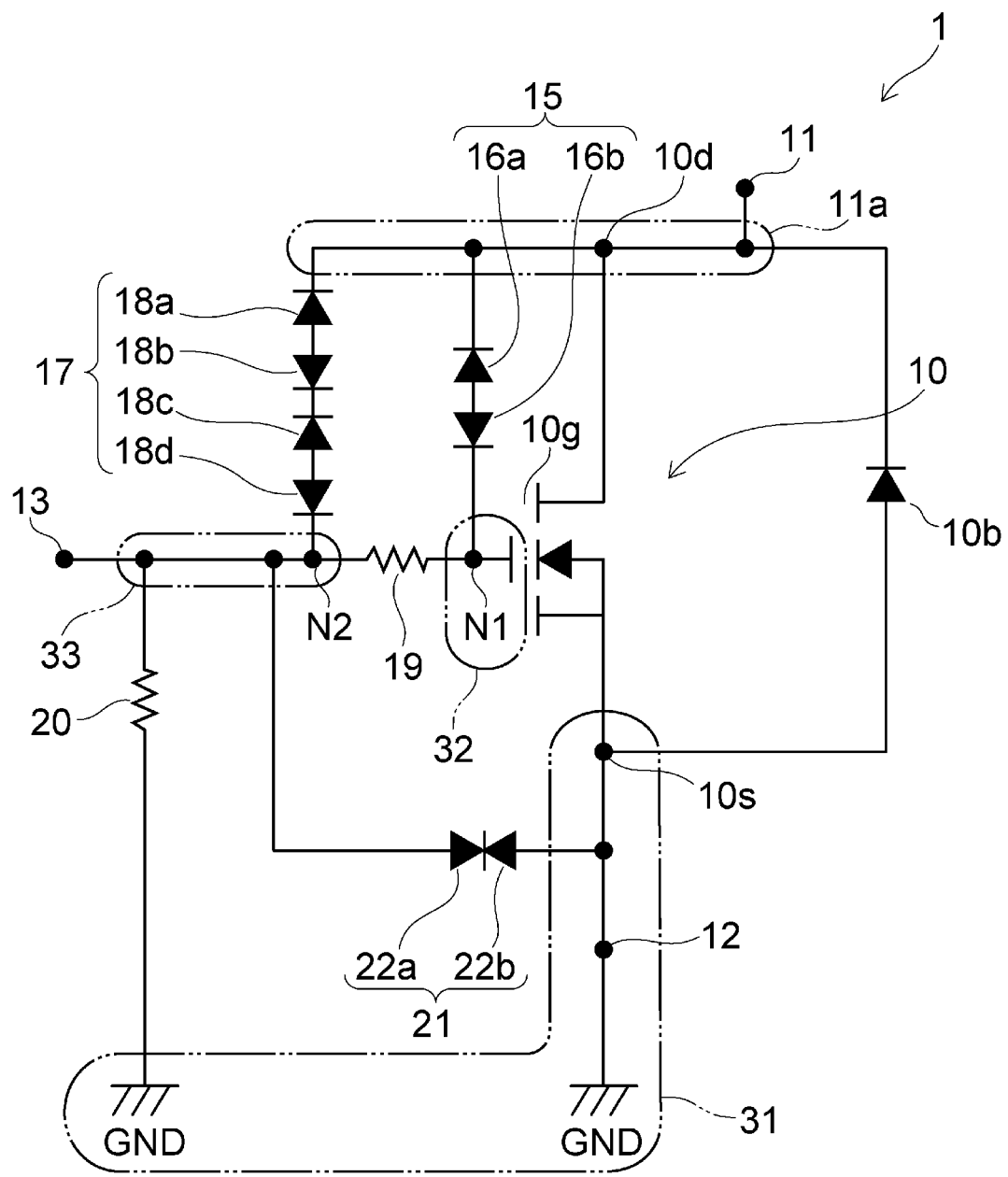
FIG. 1 is a circuit diagram depicting a semiconductor device.

FIG. 1 is a circuit diagram depicting a semiconductor device according to the present embodiment.

Figure 2:
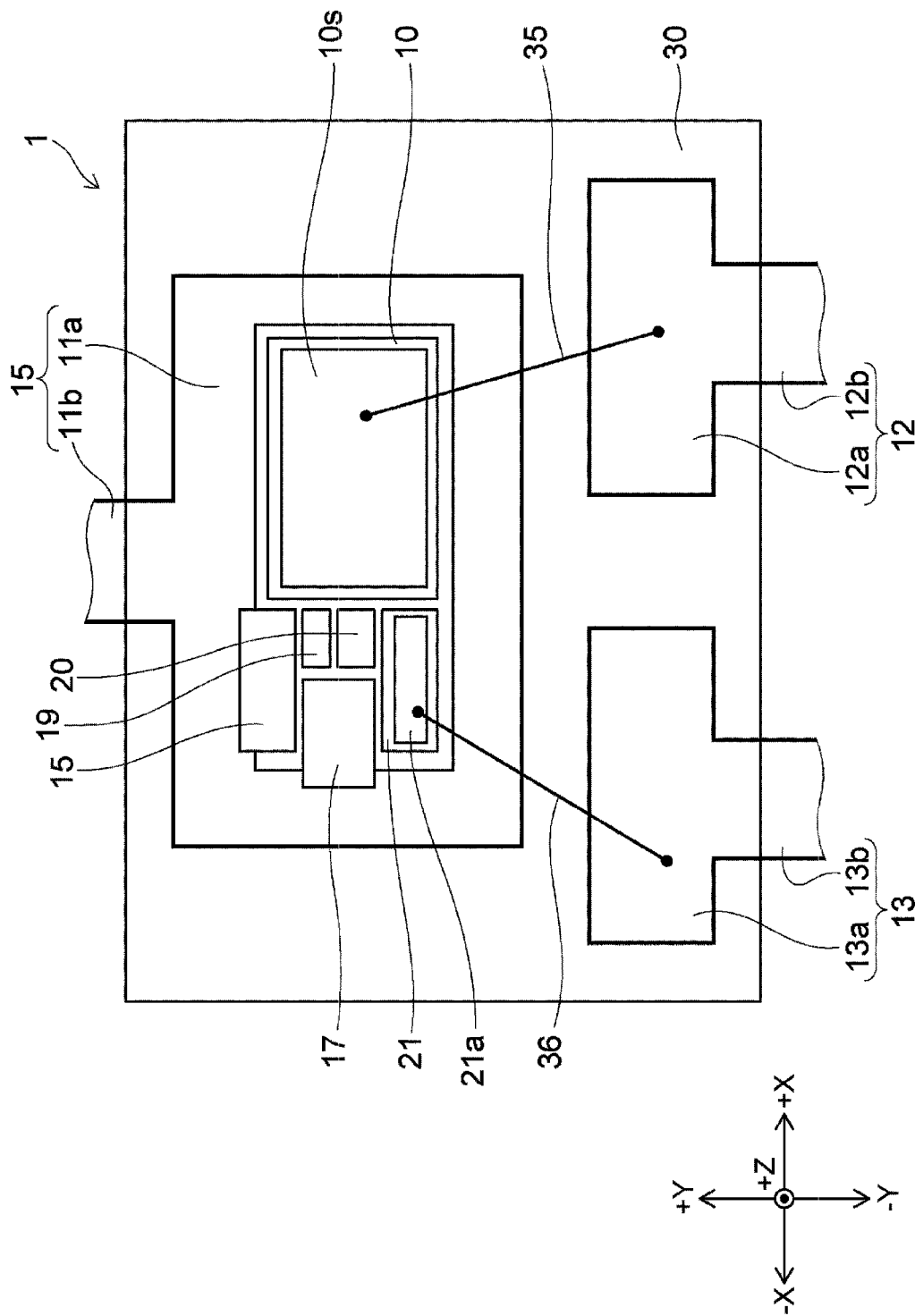
FIG. 2 is a plan view depicting the semiconductor device.

FIG. 2 is a plan view depicting the semiconductor device according to the present embodiment.

Figure 3:
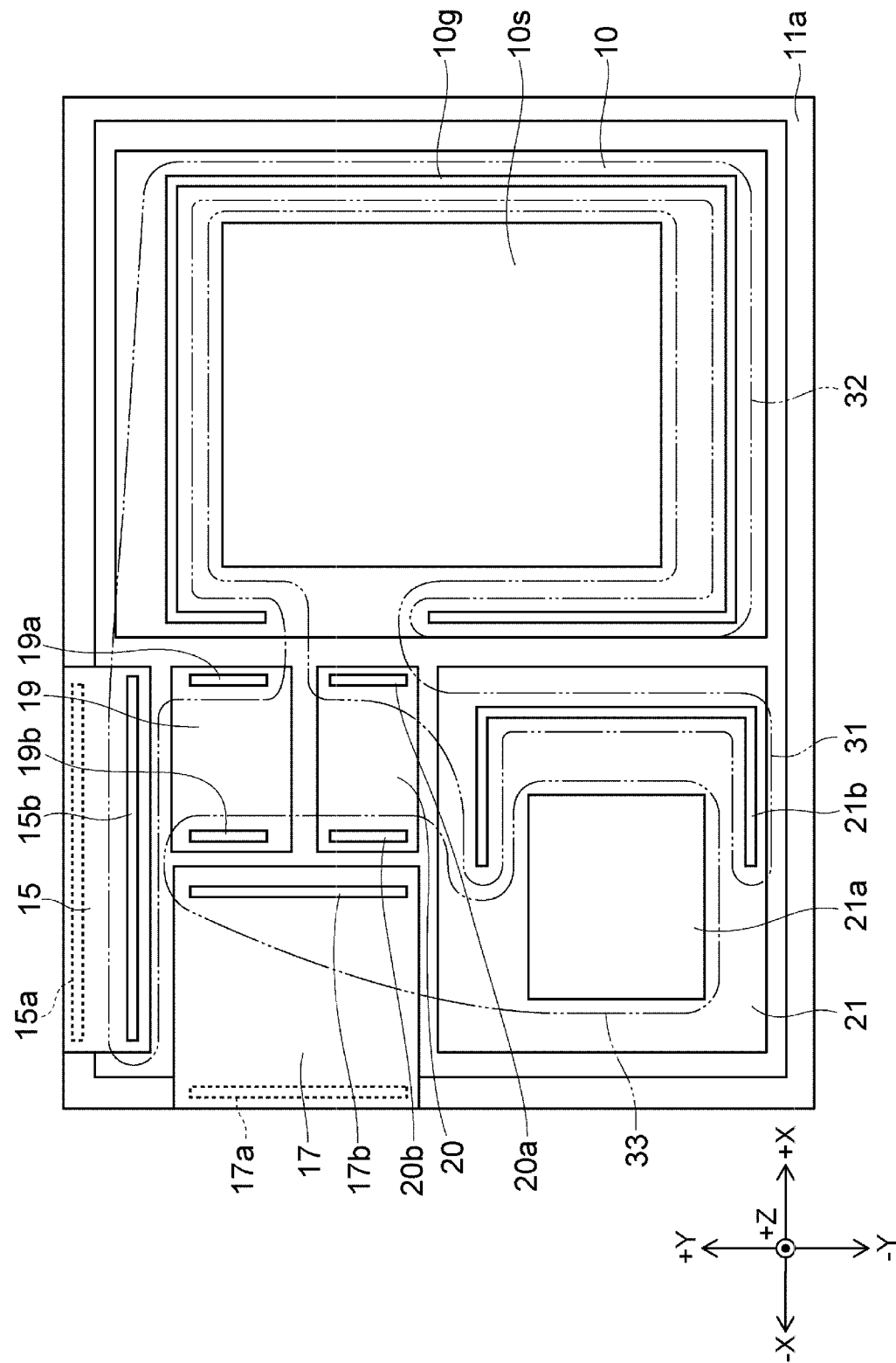
FIG. 3 is an enlarged view of the semiconductor device.

FIG. 3 is an enlarged view of FIG. 2.

As depicted in FIG. 1, in the semiconductor device 1, a MOSFET 10 is provided. In the MOSFET 10, a drain 10$d$, a source 10$s$, and a gate 10$g$ are provided, and, between the source 10$s$ and the drain 10$d$, a body diode 10$b$ is formed. The anode of the body diode 10$b$ is connected to the source 10$s$, and the cathode of the body diode 10$b$ is connected to the drain 10$d$.

Moreover, in the semiconductor device 1, a drain electrode 11, a source electrode 12, and a gate electrode 13 are provided. The drain 10$d$ is connected to the drain electrode 11, the source 10$s$ is connected to the source electrode 12, and the gate 10$g$ is connected to the gate electrode 13. The source electrode 12 is connected to a ground potential GND.

Between the drain electrode 11 and the gate electrode 13, a gate-to-drain clamping circuit 15 is connected. In the gate-to-drain clamping circuit 15, a bidirectional diode circuit element is provided. For example, two diodes 16$a$ and 16$b$ are connected in series in the gate-to-drain clamping circuit 15. The cathode of the diode 16$a$ is connected to the drain electrode 11. The anode of the diode 16$a$ is connected to the anode of the diode 16$b$. The cathode of the diode 16$b$ is connected to the gate 10$g$. The clamp voltage Vclamp1 of the gate-to-drain clamping circuit 15 is lower than the source-to-drain breakdown voltage VDSS of the MOSFET 10.

Between the drain electrode 11 and the gate electrode 13, a gate-to-drain clamping circuit 17 is also connected. Between the drain electrode 11 and the gate electrode 13, the gate-to-drain clamping circuit 15 and the gate-to-drain clamping circuit 17 are connected in parallel. In the gate-to-drain clamping circuit 17, a bidirectional diode circuit element is provided. For instance, four diodes 18$a$ to 18$d$ are connected in series in the gate-to-drain clamping circuit 17. The cathode of the diode 18$a$ is connected to the drain electrode 11. The anode of the diode 18$a$ is connected to the anode of the diode 18$b$. The cathode of the diode 18$b$ is connected to the cathode of the diode 18$c$. The anode of the diode 18$c$ is connected to the anode of the diode 18$d$. The cathode of the diode 18$d$ is connected to the gate electrode 13.

The clamp voltage Vclamp2 of the gate-to-drain clamping circuit 17 is higher than the clamp voltage Vclamp1 of the gate-to-drain clamping circuit 15 and lower than the source-to-drain breakdown voltage VDSS of the MOSFET 10. That is, Vclamp1<Vclamp2<VDSS.

Between a node N1 (located between the gate 10$g$ of the MOSFET 10 and the gate-to-drain clamping circuit 15) and a node N2 (located between the gate-to-drain clamping circuit 17 and the gate electrode 13) a gate resistor 19 is connected. Between the node N2 and the ground potential GND, a pull-down resistor 20 is connected.

Between the node N2 and the source electrode 12, a gate-to-source clamping circuit 21 is connected. In the gate-to-source clamping circuit 21, a bidirectional diode circuit element is provided. For example, diodes 22$a$ and 22$b$ are connected in series in the gate-to-source clamping circuit 21. The anode of the diode 22$a$ is connected to the node N2, the cathode of the diode 22$a$ is connected to the cathode of the diode 22$b$, and the anode of the diode 22$b$ is connected to the source electrode 12.

Next, the configuration of the semiconductor device 1 will be described from a device level.

As depicted in FIG. 2, in the semiconductor device 1, a package 30 made of a resin material, for example, is provided. For the drain electrode 11, a plate-like drain pad 11$a$ disposed in the package 30 and a drain terminal 11$b$ extending from the drain pad 11$a$ to the outside of the package 30 are integrally provided. For the source electrode 12, a plate-like bonding pad 12$a$ disposed in the package 30 and a source terminal 12$b$ extending from the bonding pad 12$a$ to the outside of the package 30 are integrally provided.

For the gate electrode 13, a plate-like bonding pad 13a disposed in the package 30 and a gate terminal 13b extending from the bonding pad 13a to the outside of the package 30 are integrally provided.

Hereinafter, for the sake of explanation, an XYZ Cartesian coordinate system is set in the semiconductor device 1. A direction toward the source electrode 12 from the gate electrode 13 is assumed to be a "+X direction" and an opposite direction thereof is assumed to be a "−X direction". Moreover, a direction toward the drain electrode 11 from the midpoint between the gate electrode 13 and the source electrode 12 is assumed to be a "+Y direction" and an opposite direction thereof is assumed to be a "−Y direction". Furthermore, one of the directions perpendicular to the +X direction and the +Y direction is assumed to be a "+Z direction", and the direction opposite the "+Z direction" is a "−Z direction". Hereinafter, the "+Z direction" is also referred to as "upper" or "upward" direction and the "−Z direction" is also referred to as "under" or "downward" direction, but these expressions are for purposes of explanatory convenience and irrelevant to the direction of gravity in a final device structure.

As depicted in FIGS. 2 and 3, the drain pad 11a, the bonding pad 12a, and the bonding pad 13a appear spread on an X-Y plane. The MOSFET 10 is mounted above (+Z direction) a region of the drain pad 11a. The MOSFET 10 covers almost half the width of the drain pad 11a in along the X axis. The MOSFET 10 is, for example, a vertical MOSFET formed in a semiconductor chip. On the lower surface of the MOSFET 10, the drain 10d (see FIG. 1) is provided and connected to the drain pad 11a. In the central region of the upper surface of the MOSFET 10, the source 10s is provided. In a region surrounding the source 10s on the upper surface of the MOSFET 10, the gate 10g (shaped like a letter C) is provided.

In a region of drain pad 11a located in the −X direction from the MOSFET 10, the gate-to-source clamping circuit 21 is mounted. In the central region on the upper surface of the gate-to-source clamping circuit 21, a rectangular pad 21a is provided, and an electrode 21b (shaped like a letter C) is provided so as to surround a portion of the pad 21a.

In a region on the drain pad 11a in the +Y direction from the gate-to-source clamping circuit 21 and in the −X direction from MOSFET 10, the gate-to-drain clamping circuit 17 is mounted. On the lower surface of the gate-to-drain clamping circuit 17, an electrode 17a is provided and connected to the drain pad 11a. On the upper surface of the gate-to-drain clamping circuit 17, an electrode 17b is provided.

About midway between the MOSFET 10 and the gate-to-drain clamping circuit 17 along the −Y direction from MOSFET 10, the pull-down resistor 20 is mounted. At one end of the pull-down resistor 20 on the upper surface thereof in the +X direction, an electrode 20a is provided and, at another end in the −X direction, an electrode 20b is provided.

About midway between the MOSFET 10 and the gate-to-drain clamping circuit 17, the gate resistor 19 is mounted. At one end of the gate resistor 19 on the upper surface thereof in the +X direction, an electrode 19a is provided and, at another end in the −X direction, an electrode 19b is provided.

In the +Y direction from the gate-to-drain clamping circuit 17 and the gate resistor 19, the gate-to-drain clamping circuit 15 is mounted. On the lower surface of the gate-to-drain clamping circuit 15, an electrode 15a is provided and connected to the drain pad 11a. On the upper surface of the gate-to-drain clamping circuit 15, an electrode 15b is provided.

On the MOSFET 10, the gate-to-drain clamping circuit 15, the gate-to-drain clamping circuit 17, the gate-to-source clamping circuit 21, the pull-down resistor 20, and the gate resistor 19, a source contact layer 31, a gate contact layer 32, and a gate contact layer 33 are provided so as to be separated from one another. It is to be noted that, in FIG. 2, the source contact layer 31, the gate contact layer 32, the gate contact layer 33, and the above-described electrodes are not specifically depicted so as to make the certain details of the drawing easier to see.

The source contact layer 31 is connected to the source 10s of the MOSFET 10, the electrode 20a of the pull-down resistor 20, and the electrode 21b of the gate-to-source clamping circuit 21. The gate contact layer 32 is connected to the gate 10g of the MOSFET 10, the electrode 19a of the gate resistor 19, and the electrode 15b of the gate-to-drain clamping circuit 15. The gate contact layer 33 is connected to the pad 21a of the gate-to-source clamping circuit 21, the electrode 20b of the pull-down resistor 20, and the electrode 17b of the gate-to-drain clamping circuit 17.

Moreover, one end of a metal thin wire 35 is bonded to a portion of the source contact layer 31 which is disposed immediately above the source 10s. The other end of the metal thin wire 35 is bonded to the bonding pad 12a. One end of a metal thin wire 36 is bonded to a portion of the gate contact layer 33 which is disposed immediately above the pad 21a. The other end of the metal thin wire 36 is bonded to the bonding pad 13a. Both the metal thin wires 35 and 36 are encased in the package 30.

Next, an operation of the semiconductor device 1 according to the present embodiment will be described.

Figure 4A:
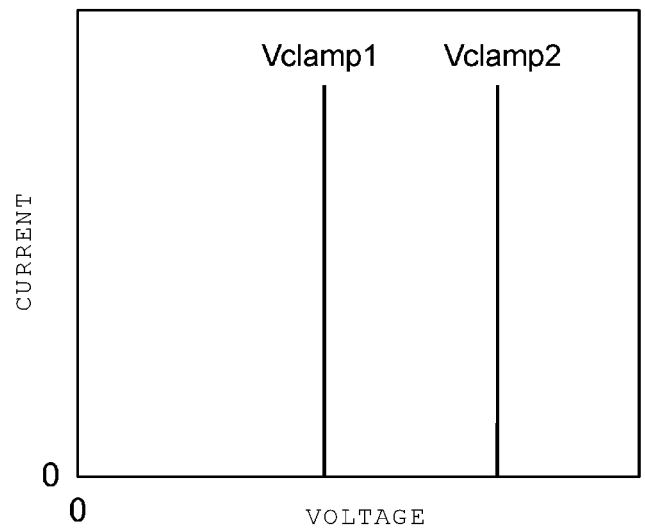
FIG. 4A is a graph depicting the V-I characteristics of a clamping circuit with a horizontal axis representing a voltage and a vertical axis representing a current.
Figure 4B:
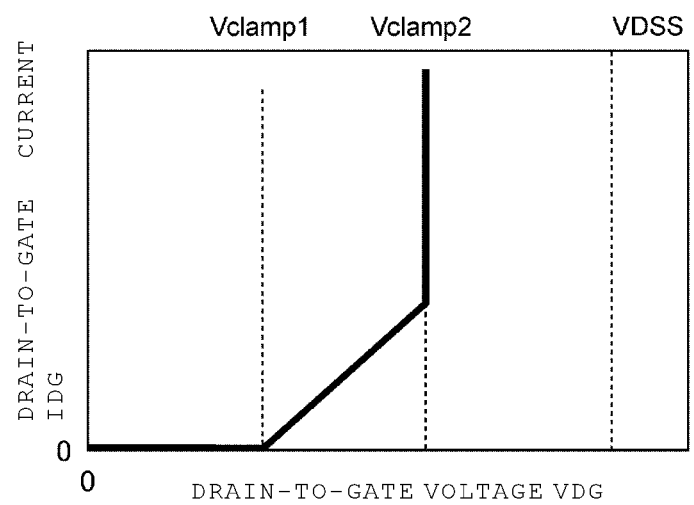
FIG. 4B is a graph depicting the V-I characteristics of the semiconductor device with a horizontal axis representing a drain-to-gate voltage and a vertical axis representing a drain-to-gate current.

FIG. 4A is a graph depicting the V-I characteristics of the clamping circuit with a horizontal axis representing a voltage and a vertical axis representing a current, and FIG. 4B is a graph depicting the V-I characteristics of the semiconductor device 1 according to the present embodiment with a horizontal axis representing a drain-to-gate voltage and a vertical axis representing a drain-to-gate current.

As depicted in FIG. 4A, the gate-to-drain clamping circuit 15 passes virtually no current when the voltage which is applied thereto is less than the clamp voltage Vclamp1 and passes the current abruptly when the voltage reaches the clamp voltage Vclamp1. Likewise, the gate-to-drain clamping circuit 17 passes virtually no current when the voltage which is applied thereto is less than the clamp voltage Vclamp2 and passes the current abruptly when the voltage reaches the clamp voltage Vclamp2. The clamp voltage Vclamp2 is higher than the clamp voltage Vclamp1 and lower than the source-to-drain breakdown voltage VDSS of the MOSFET 10.

For this reason, as depicted in FIG. 4B, when a voltage VDG between the drain electrode 11 and the gate electrode 13 is continuously increased from zero, the semiconductor device 1 operates as follows.

When the voltage VDG is less than the clamp voltage Vclamp1, since both the gate-to-drain clamping circuit 15 and the gate-to-drain clamping circuit 17 do not break down (and the MOSFET 10 does not break down either), almost no drain-to-gate current IDG flows.

When the voltage VDG exceeds the clamp voltage Vclamp1, the gate-to-drain clamping circuit 15 is clamped and made to be conductive. However, since the gate-to-drain clamping circuit 15 and the gate resistor 19 are connected in series between the drain electrode 11 and the gate electrode 13, a large current does not flow suddenly and the current IDG gradually increases with an increase in the voltage VDG. As a result, the current input to the drain electrode 11 is gradually consumed. Moreover, as a result of the flow of the current IDG, the potential at the node N1 increases, whereby the MOSFET 10 is gradually brought into the conductive state and the current begins to flow also between the drain and the source of the MOSFET 10. This also causes the current to be consumed.

When the voltage VGD reaches the clamp voltage Vclamp2, the gate-to-drain clamping circuit 17 is clamped and brought into the conductive state. As a result, the current IDG flows through the gate-to-drain clamping circuit 17. However, at this point in time, since at least part of the current is consumed via the gate-to-drain clamping circuit 15 and the MOSFET 10, the current IDG that flows through the gate-to-drain clamping circuit 17 is curbed.

As a result of the current IDG flowing through the gate-to-drain clamping circuit 17, the voltage VDG does not increase anymore and does not reach the breakdown voltage VDSS of the MOSFET 10. Moreover, as a result of a further increase of the potential at the node N1, the MOSFET 10 is brought to be further conductive and passes the current between the drain and the source of the MOSFET 10. As a result, the MOSFET 10 can be protected.

Next, an example of how the semiconductor device 1 according to the present embodiment can be used will be described.

Figure 5:
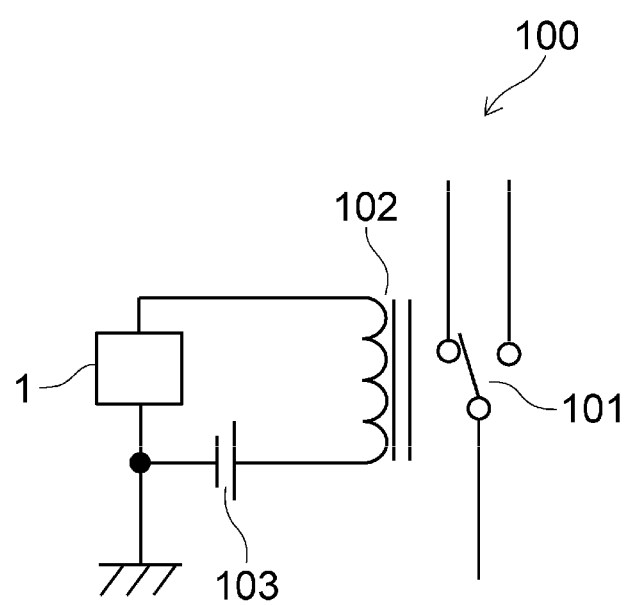
FIG. 5 is a circuit diagram depicting an example of how the semiconductor device can be used.

FIG. 5 is a circuit diagram depicting an example of how the semiconductor device 1 according to the present embodiment can be used.

As depicted in FIG. 5, the semiconductor device 1 is used as a switch circuit of a mechanical relay 100. In the mechanical relay 100, a mechanical switch 101 is provided, and a coil 102 is provided near the mechanical switch 101. To the coil 102, a direct-current power supply 103 and the semiconductor device 1 are connected in series. A force is constantly applied to the mechanical switch 101, which makes the mechanical switch 101 maintain one of its states unless a magnetic force from the coil 102 is applied to the mechanical switch.

As depicted in FIG. 5 and FIG. 1, when an ON potential is input to the gate electrode 13 1, the MOSFET 10 is brought into the conductive state and a current flows through a closed circuit including the direct-current power supply 103, the coil 102, and the semiconductor device 1. As a result, the coil 102 generates a magnetic field and switches the mechanical switch 101 using magnetic force. On the other hand, when an OFF potential is input to the gate electrode 13, the MOSFET 10 is brought into the nonconductive state and the magnetic force of the coil 102 disappears. This returns the mechanical switch 101 to its original switch state.

With switching of the MOSFET 10 between a conducting state and a nonconducting state, an induced current is generated due to an inductance of the coil 102, and the voltage VDG is applied between the drain and the gate of the MOSFET 10. At this time, in the semiconductor device 1, as a result of the above-described operation, even when the voltage VDG is applied, the MOSFET 10 can be protected and the DG clamping circuits 17 and 15 can also be protected.

According to the present embodiment, the gate-to-drain clamping circuit 15 and the gate resistor 19 are provided in parallel with respect to the gate-to-drain clamping circuit 17, and the clamp voltage Vclamp1 of the gate-to-drain clamping circuit 15 is set so as to be lower than the clamp voltage Vclamp2 of the gate-to-drain clamping circuit 17. By so doing, the gate-to-drain clamping circuit 15 breaks down before the gate-to-drain clamping circuit 17 breaks down, and, by gradually passing a current via the gate resistor 19, the breakdown of the gate-to-drain clamping circuit 17 can be prevented. As a result, the MOSFET 10 can be reliably protected. As described above, the semiconductor device 1 according to the present embodiment is highly tolerant of an electrical load which is applied from the outside.

Moreover, by adjusting the resistance value of the gate resistor 19, the magnitude of a current which flows when the gate-to-drain clamping circuit 15 is clamped can be regulated so as to be within an allowable range.

If the gate-to-drain clamping circuit 15 is not provided, a large current suddenly flows through the gate-to-drain clamping circuit 17 when the drain-to-gate voltage VDG reaches the clamp voltage Vclamp2, which may cause a breakdown of the gate-to-drain clamping circuit 17. After the gate-to-drain clamping circuit 17 is broken down, the subsequent effective protection of the MOSFET 10 becomes impossible, which results in a reduction in the avalanche tolerance of the semiconductor device 1.

In contrast, according to the present embodiment, by providing the gate-to-drain clamping circuit 15 as described above, the avalanche tolerance of the semiconductor device 1 can be increased, for example, to about 1.5 times what it was, and the device reliability can be increased.

The above-described embodiment can provide a semiconductor device that is highly tolerant of an electrical load which is applied from the outside.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a field-effect transistor having a gate, a drain, and a source, the drain and the source being electrically distinct from one another;
   a first clamping circuit connected between the drain and the gate and having a first clamp voltage that is lower than a source-to-drain breakdown voltage of the field-effect transistor;
   a first resistor having a first end connected to a first node between the first clamping circuit and the gate; and
   a second clamping circuit connected between the drain and a second end of the first resistor and having a second clamp voltage that is higher than the first clamp voltage and lower than the source-to-drain breakdown voltage.

2. The semiconductor device according to claim 1, wherein the first clamping circuit comprises a bidirectional diode circuit element including at least two diodes connected in series in opposite directions.

3. The semiconductor device according to claim 1, wherein the second clamping circuit comprises a bidirectional diode circuit element including at least two diodes connected in series in opposite directions.

4. The semiconductor device according to claim 1, wherein the first clamping circuit comprises a first bidirectional diode circuit element including two diodes connected in series anode-to-anode between the gate and the drain of the field-effect transistor, and the second clamping circuit comprises a second bidirectional diode circuit element including a first pair of diodes connected in series anode-to anode and a second pair of diodes connected in series anode-to-anode, the first pair and the second pair being connected in series with each other between the second end of the first resistor and the drain of the field-effect transistor, and a cathode of a diode in the first pair is connected to a cathode of a diode in the second pair.

5. The semiconductor device according to claim 1, wherein the field-effect transistor is in a semiconductor chip attached to a surface of a lead frame, a drain electrode of the field-effect transistor is facing the surface and electrically connected to the lead frame and the drain of the field-effect transistor, the first clamping circuit is attached to the surface of the lead frame spaced from the field-effect transistor in a first direction, and the second clamping circuit is attached to the surface of the lead frame spaced from the field-effect transistor in the first direction, wherein the first clamping circuit and the second clamping circuit are each electrically connected to the drain electrode via the lead frame.

6. The semiconductor device according to claim 1, wherein the first clamping circuit includes a bidirectional diode, and the second clamping circuit includes a bidirectional diode.

7. The semiconductor device according to claim 1, further comprising:

a second resistor having one end connected to a reference potential node and another end connected to the second clamping circuit and the second end of the first resistor.

8. The semiconductor device according to claim 1, further comprising:

a third clamping circuit connected between the source of the field-effect transistor and the second end of the first resistor.

9. The semiconductor device according to claim 8, wherein the third clamping circuit includes a bidirectional diode.

10. The semiconductor device according to claim 9, wherein the bidirectional diode comprises a pair of diodes connected in series cathode-to-cathode.

11. The semiconductor device according to claim 1, wherein at least one of the source and drain of the field effect transistor is electrically connected to a coiled wire.

12. The semiconductor device according to claim 1, further comprising:

a coiled wire; and a mechanical switch proximate to the coiled wire, wherein the field-effect transistor is configured control an electrical current passing through the coiled wire to change a switching state of the mechanical switch by electromagnetic force.

13. A packaged semiconductor device, comprising:

a first lead frame including a first pad portion and a first external connection portion extending from the first pad portion;

a semiconductor chip disposed on the first pad portion and including a transistor having a gate electrode, a drain electrode, and a source electrode, the drain electrode facing the first pad portion, being electrically connected to the first pad portion, and being electrically distinct from the source electrode;

a first clamping circuit element disposed on the first pad portion spaced from the semiconductor chip and having a first end electrically connected to the drain electrode via the first pad portion and a second end electrically connected to the gate electrode, the first clamping circuit element having a first clamp voltage that is lower than a source-to-drain breakdown voltage of the transistor; and a second clamping circuit element disposed on the first pad portion spaced from the semiconductor chip, a first end of the second clamping circuit being electrically connected to the drain electrode and a second end electrically connected to the gate electrode via a first resistor, the second clamping circuit element having a second clamp voltage that is higher than the first clamp voltage and lower than the source-to-drain breakdown voltage of the transistor, wherein the source electrode faces away from the first pad portion and is electrically connected to a second lead frame element via a first bonding wire, and the gate electrode is electrically connected to a third lead frame element via a second bonding wire connected to the second end of the second clamping circuit element.

14. The packaged semiconductor device according to claim 13, wherein the first pad portion, the semiconductor chip, the first clamping circuit element, the second clamping circuit element, the first bonding wire, and the second bonding wire are encased in a resin material from which at least a portion of the first external connection portion, a portion of the second lead frame element, and a portion of the third lead frame element are exposed.

15. The packaged semiconductor device according to claim 13, further comprising:

a second resistor having one end electrically connected to a reference potential node and another end electrically connected to the second end of second clamping circuit element.

16. The packaged semiconductor device according to claim 13, further comprising:

a third clamping circuit element electrically connected between the source electrode of the transistor and the second end of the second clamping circuit element.

17. The packaged semiconductor device according to claim 16, wherein the first clamping circuit element includes a first pair of diodes connected in series anode-to-anode, the second clamping circuit element includes a second pair of diodes connected in series anode-to-anode, a third pair of diodes connected in series anode-to-anode, the second and third pairs being connected in series with each other cathode-to-cathode, and the third clamping circuit element includes a fourth pair of diodes connected in series cathode-to-cathode.

18. The packaged semiconductor device according to claim 13, wherein one of the second and third lead frames is connected to a coiled wire element and the other of the second and third lead frames is connected to a direct current power source.

19. A mechanical relay, comprising:

a mechanical switch having a first switching state and a second switching state;

a coiled wire element proximate to the mechanical switch and configured to provide an electromagnetic force to the mechanical switch to cause a change from the first switching state to the second switching state when an electrical current is passed through the coiled wire element; and a semiconductor device configured to control the electrical current passing through coiled wire element according to a control signal supplied to the semiconductor device, the semiconductor device including:

a field-effect transistor having a gate to which the control signal is applied, a drain, and a source, the drain and the source being electrically distinct from one another;

a first clamping circuit connected between the drain and the gate and having a first clamp voltage that is lower than a source-to-drain breakdown voltage of the field-effect transistor;

a first resistor having a first end connected to a first node between the first clamping circuit and the gate; and a second clamping circuit connected between the drain and a second end of the first resistor and having a second clamp voltage is higher than the first clamp voltage and lower than the source-to-drain breakdown voltage.

20. The mechanical relay according to claim 19, wherein the first clamping circuit includes a first pair of diodes connected in series anode-to-anode, and the second clamping circuit includes a second pair of diodes connected in series anode-to-anode, a third pair of diodes connected in series anode-to anode, the second and third pairs being connected in series with each other cathode-to-cathode.

* * * * *